(12) United States Patent
Voo

(10) Patent No.: US 8,339,205 B1
(45) Date of Patent: *Dec. 25, 2012

(54) LOW POWER WIDE-BAND AMPLIFIER WITH REUSED CURRENT

(75) Inventor: Thart Fah Voo, Singapore (SG)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 13/369,175

(22) Filed: Feb. 8, 2012

Related U.S. Application Data

(63) Continuation of application No. 12/836,146, filed on Jul. 14, 2010, now Pat. No. 8,125,272.

(60) Provisional application No. 61/225,390, filed on Jul. 14, 2009.

(51) Int. Cl.
*H03F 3/04* (2006.01)

(52) U.S. Cl. ........................... 330/310; 330/311

(58) Field of Classification Search ............... 330/98, 330/150, 252, 310, 311
See application file for complete search history.

(56) References Cited

U.S. PATENT DOCUMENTS

| | | | |
|---|---|---|---|
| 6,987,422 B2 | 1/2006 | Vice | |
| 7,221,217 B2 | 5/2007 | Choi et al. | |
| 7,570,119 B2 | 8/2009 | Hamaguchi | |
| 7,619,482 B1* | 11/2009 | Kobayashi | 330/311 |
| 7,940,126 B2* | 5/2011 | Choi et al. | 330/311 |
| 7,956,692 B2* | 6/2011 | Jeong et al. | 330/302 |

* cited by examiner

*Primary Examiner* — Henry Choe

(57) ABSTRACT

In one embodiment, an apparatus includes a first amplification block configured to receive a signal and a second amplification block configured to output the signal. The outputted signal is an amplified version of the signal. A circuit allows reuse of a second current flowing through the second amplification block by coupling the second current to pass through the first amplification block to increase a first current that flows through the first amplification block. Amplification of the signal is based on the increased first current that flows through the first amplification block.

20 Claims, 6 Drawing Sheets

LOW POWER WIDE-BAND AMPLIFIER WITH REUSED CURRENT

CROSS REFERENCE TO RELATED APPLICATIONS

The present disclosure is a continuation of U.S. patent application Ser. No. 12/836,146 for "Low Power Wide-Band Amplifier with Reused Current" filed Jul. 14, 2010, which claims priority to U.S. Provisional App. No. 61/225,390 for "Low Power Wide-Band Amplifier with Reused Current" filed Jul. 14, 2009, both of which are incorporated herein by reference in their entirety for all purposes.

BACKGROUND

Particular embodiments generally relate to amplifiers.

Unless otherwise indicated herein, the approaches described in this section are not prior art to the claims in this application and are not admitted to be prior art by inclusion in this section.

FIG. 1 depicts a conventional amplifier 100. Amplifier 100 is used to amplify a signal input at a node Vin and output at a node Vout. For example, amplifier 100 may be used in a transceiver that receives a radio frequency (RF) signal that is amplified using amplifier 100. A signal path for the RF signal is shown at 102. The signal goes through a first alternating current (AC) coupling capacitor Ca, a transistor M1, a second AC coupling capacitor Cb, and a transistor M2. AC coupling capacitors Ca and Cb couple the AC signal from node Vin to node Vout. Using AC coupling capacitors Ca and Cb require tuning of amplifier 100 to adjust the resonant frequency to suit the frequency band needed for amplifier 100.

Also, a first biasing voltage (VB1) and a second biasing voltage (VB2) are used to bias transistors M1 and M2. Transistors M1 and M2 are biased such that a direct current (DC) current biasing path flows at 104.

Transistor M1 may be isolated from a transistor M2 over a frequency range where amplifier 100 exhibits useful gain. The gain may be in the form of two amplifiers represented by transistor M1 and inductor L1 in one amplifier and transistor M2 and inductor L2 in another. Also, inductor (L1) 108 and a capacitor (Cc) 110 in isolation circuit 106 are used to isolate transistors M1 and M2. For example, isolation circuit 106 has a high impedance and high gain in a narrow frequency range.

FIG. 2 depicts a graph 200 showing an example of the frequency response for the gain of amplifier 100 using isolation circuit 106. The transceiver may operate over a wideband range of frequency, which is from 1 megahertz (MHz) to 1 gigahertz (GHz) in this example. However, a narrow frequency range at 202 is where inductor 108 and capacitor 110 have a high impedance, which isolates transistor M1 from transistor M2. With transceivers operating in a wideband frequency range, the narrow frequency band isolation offered by inductor 108 and capacitor 110 may be insufficient. Thus, a wideband amplifier cannot be offered using amplifier 100 because transistor M1 and transistor M2 are not isolated over a wideband of frequencies.

SUMMARY

In one embodiment, an apparatus includes a first amplification block configured to receive a signal and a second amplification block configured to output the signal. The outputted signal is an amplified version of the signal. A circuit allows reuse of a second current flowing through the second amplification block by coupling the second current to pass through the first amplification block to increase a first current that flows through the first amplification block. Amplification of the signal is based on the increased first current that flows through the first amplification block.

In one embodiment, the circuit provides isolation between the first amplification block and the second amplification block to restrict the signal from flowing through the circuit.

In one embodiment, the second current is a bias current for the second amplification block.

In one embodiment, the increase of the first current increases a transductance of a transistor of the first amplification block.

In another embodiment, a method includes combining a first current at a first amplification block with a second current, wherein the second current is passed through a second amplification block and a circuit to the first amplification block; passing the first current and the second current through the first amplification block; and passing a signal through the first amplification block to the second amplification block to output an amplified version of the signal, wherein amplification of the signal is based on the first current and the second current being passed through the first amplification block.

The following detailed description and accompanying drawings provide a more detailed understanding of the nature and advantages of the present invention.

DETAILED DESCRIPTION

Described herein are techniques for a wideband amplifier. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
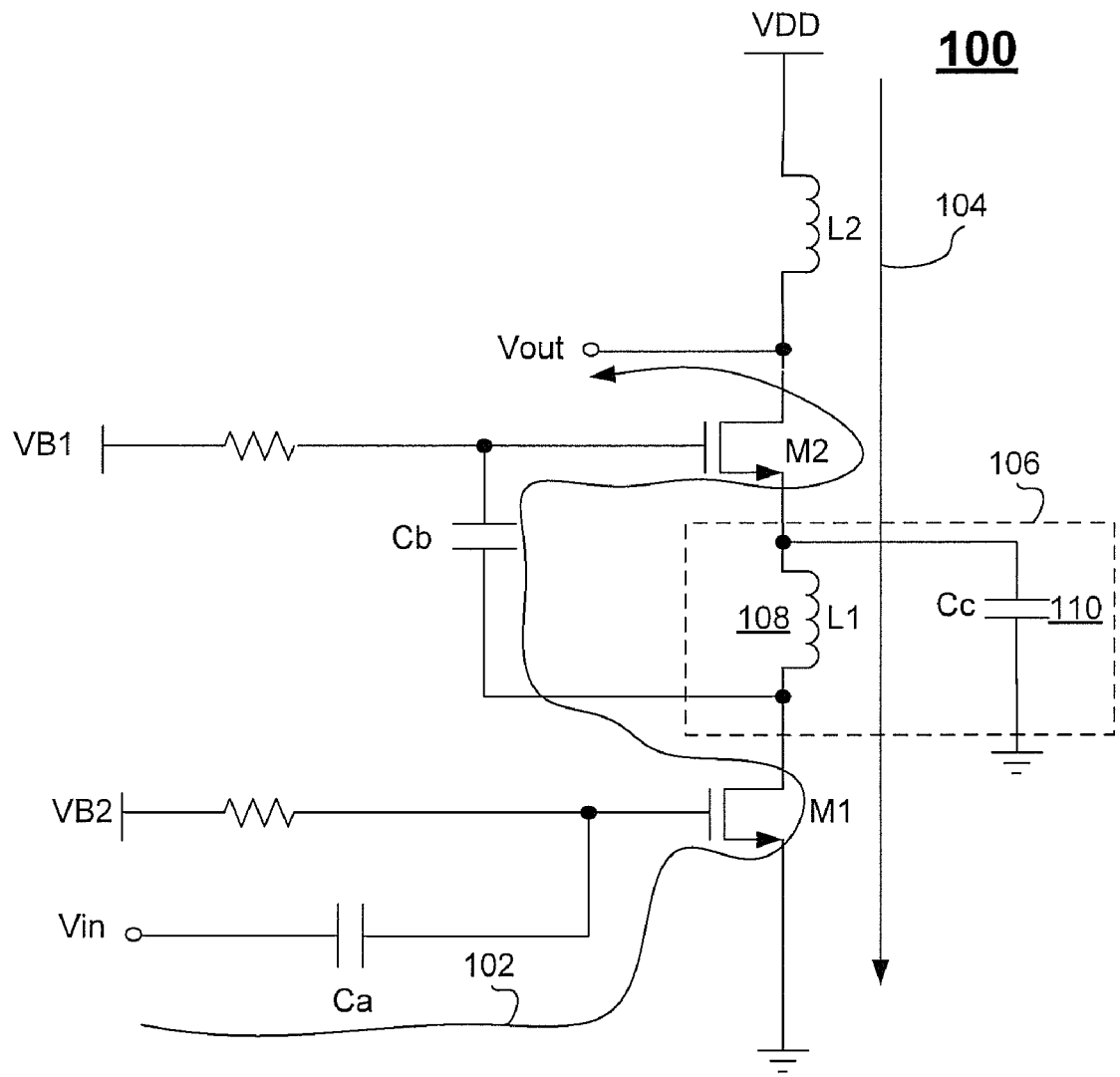
FIG. 1 depicts a conventional amplifier.
Figure 2:
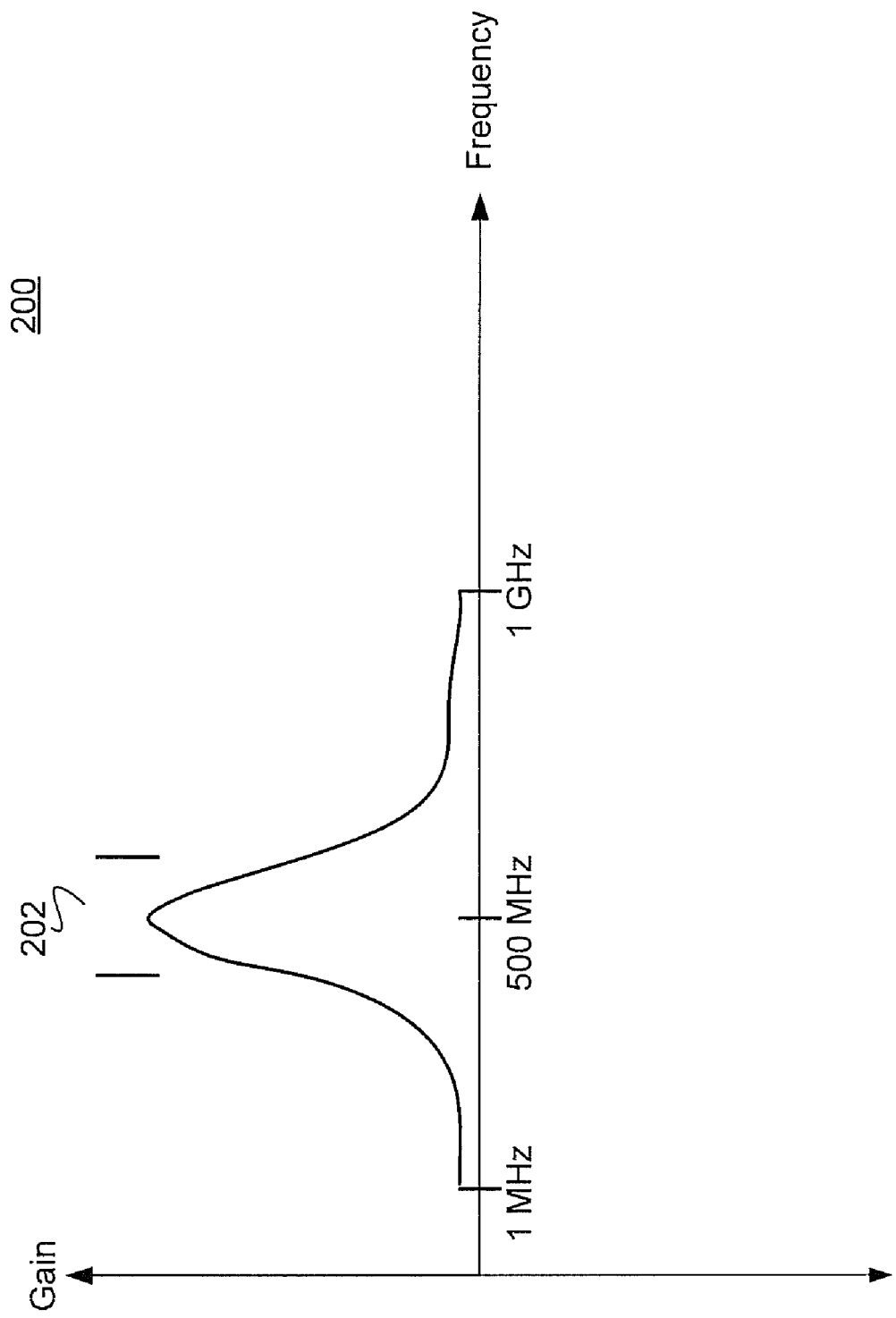
FIG. 2 depicts a graph showing an example of the frequency response for the gain of the amplifier using an isolation circuit.
Figure 3:
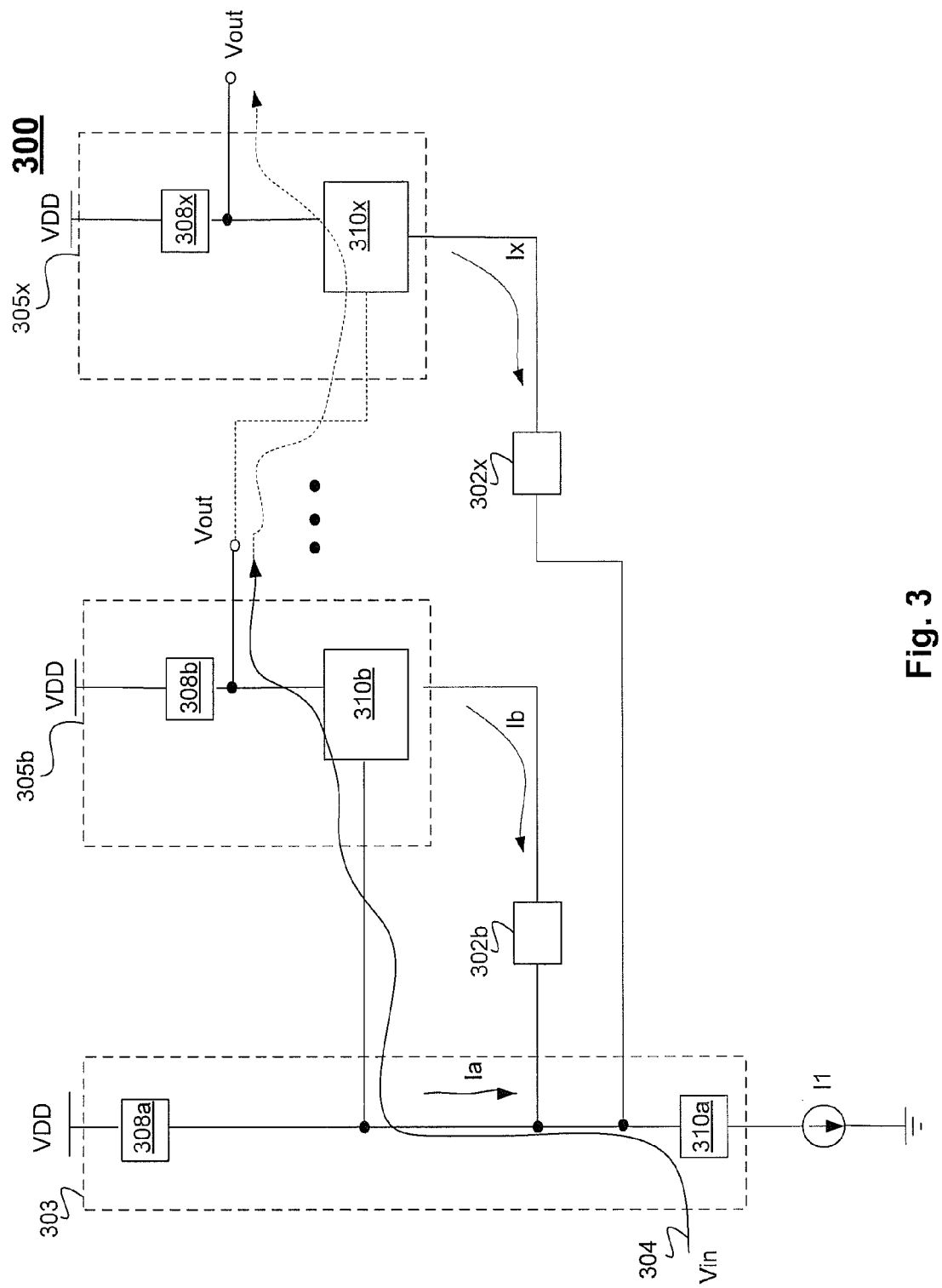
FIG. 3 depicts an example of an amplifier according to one embodiment.

FIG. 3 depicts an example of an amplifier 300 according to one embodiment. In this example, a single-ended version of amplifier 300 is described for discussion purposes. A differential amplifier version will be described in more detail below.

Amplifier 300 may be used in a transceiver for wireless communications. For example, amplifier 300 may be used in a low noise amplifier (LNA). LNAs are a class of amplifiers used in a receiver portion of a transceiver to amplify signals from an antenna. Accordingly, a radio frequency signal received from an antenna may be amplified by amplifier 300.

Particular embodiments provide current reuse of a bias current. The current reuse of the bias current increases the transductance (gm) for a transistor of amplifier 300, which improves the performance of amplifier 300 by reducing noise in the signal path. Additionally, isolation is provided without using an inductor-capacitor (LC) circuit, which increases the bandwidth of amplifier 300.

An isolation circuit 302 may provide isolation between a first block 303 and a second block 305. As shown, multiple gain stages may be used in amplifier 300. For example, second blocks 305b-305x and isolations circuits 302a-302x may be used. For discussion purposes, first block 303 and second block 305b will be mainly discussed. A person of skill in the art will understand how to implement a multiple gain amplifier based on the teachings and discussion herein. Isolation may restrict the signal from flowing through isolation circuit 302 in a certain direction. The restriction allows a larger portion of the signal to flow in a different direction as will be described below. In one embodiment, a higher impedance in the direction through isolation circuit 302 than a path not through isolation circuit 302 is used to restrict the signal from flowing through isolation circuit 302.

First block 303 includes a first load 308a and a first amplification block 310a. Second block 305b includes a second load 308b and a second amplification block 310b. Second block 305x includes a second load 308x and a second amplification block 310x. Loads 308 may include inductors, capacitors, transistors, resistors, or any combination thereof. Amplification blocks 310 may include devices that can amplify a signal, such as transistors.

Isolation circuit 302 allows the current reuse of a bias current through amplification block 310b by allowing the bias current to pass through amplification block 310a. This increases the current that flows through amplification block 310a. If amplification block 310a includes a transistor, increasing the current flowing through amplification block 310a increases the transductance gm, which increases the gain and decreases the noise in amplifier 300 and improves the performance of amplifier 300.

In amplifier 300, a signal, such as a radio frequency (RF) signal is input at an input node Vin. The signal is amplified and output at an output node Vout through a signal path at 304. The signal that is amplified flows amplification block 310a and amplification block 310b to the output Vout. amplification block 310a and amplification block 310b amplify the signal.

Bias currents Ia and Ib are used to bias amplifier 300. Bias current Ib flows through amplification block 310b. Bias current Ia flows through amplification block 310a. The bias currents Ia and Ib are combined and equal the current I1. If multiple gain stages are used, then the current Ix is combined with the currents Ia and Ib, i.e., currents Ia+Ib+Ix=current I1.

Isolation circuit 302 includes components that have a high impedance such that the signal does not flow through isolation circuit 302. For example, the signal flowing through the signal path at 304 does not flow through isolation circuit 302 due to the high impedance looking into isolation circuit 302 in that direction. Rather, a path through amplification block 310b has a lower impedance and the signal takes that path.

Isolation circuit 302, however, couples a power path that allows the DC bias current Ib to flow through the circuit from amplification block 310b to amplification block 310a. This is because there is a low impedance looking into isolation circuit 302 in that direction. Current reuse is thus provided as the bias current Ib is reused and allowed to pass through amplification block 310a. The bias current Ib is combined with the bias current Ia to pass through amplification block 310a.

Figure 4:
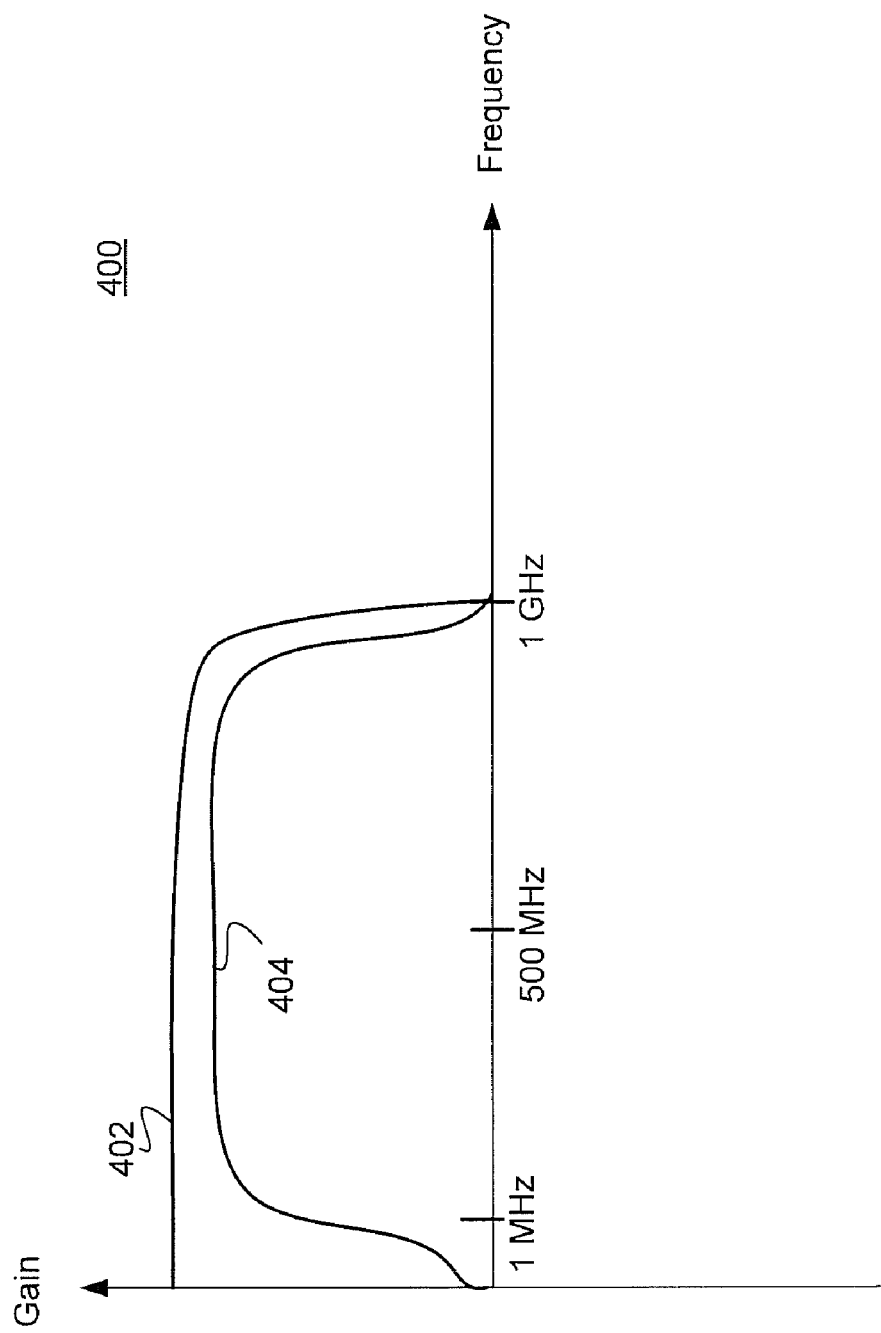
FIG. 4 shows a graph of the gain for the amplifier according to one embodiment.

As will be described in more detail below, isolation circuit 302 provides isolation across the frequency spectrum for gain of amplifier 300. This is because an AC or DC coupling may be used in the signal path shown at 304 without using an inductor in isolation circuit 302. Thus, the range of operation for amplifier 300 is across a wideband of frequencies. FIG. 4 shows a graph 400 of the gain for amplifier 300 according to one embodiment. As shown, the DC coupling provides a gain across a wideband of frequencies shown at 402. A gain shown at 404 occurs when an AC coupling capacitor is used in the signal path and will be described below.

If the operation of a transceiver (not shown) that is receiving the RF signal is between 1 MHz and 1 GHz, the gain is across a wideband of the frequency of operation. Thus, amplifier 300 is not limited to the narrowband gain provided when using the inductor in the isolation circuit.

Figure 5:
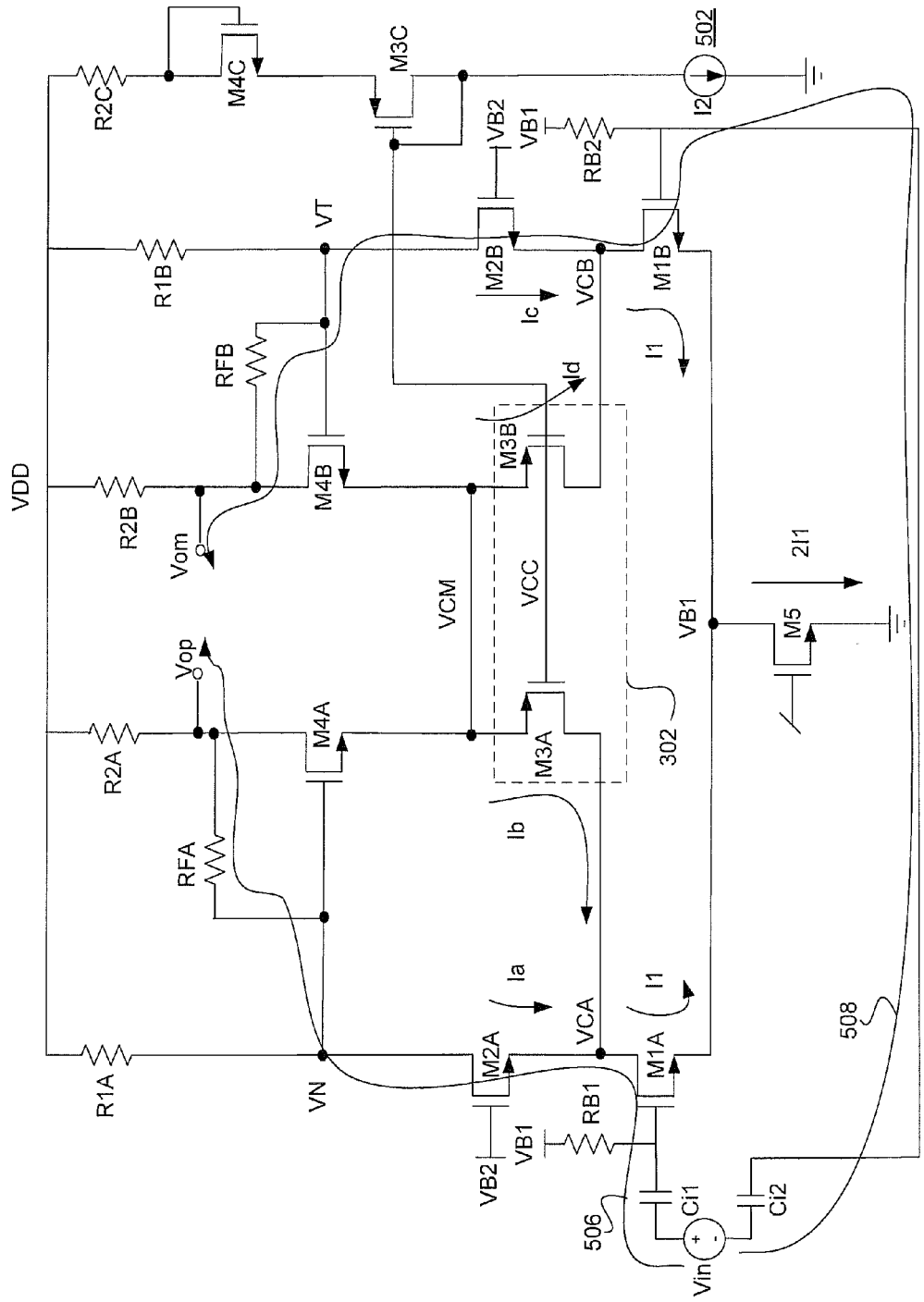
FIG. 5 shows a more detailed example of the amplifier according to one embodiment.

FIG. 5 shows an example of an amplifier 500 according to one embodiment. Amplifier 500 may be a differential amplifier that outputs a differential signal at output nodes Vop and Vom.

In one example, first block 303 may include a resistor R1A, a transistor M2A, and a transistor M1A. Second block 305b includes resistors R2A and RFA, and a transistor M4A. First amplification block 310a includes a transistor M1A and a transistor M2A. Second amplification block includes a transistor M4A, a resistor RFA, and a resistor R2A. The differential version of first block 303, second block 305b, first amplification block 310a, and second amplification block 310b are also included.

Isolation circuit 302 may be implemented using active devices. For example, isolation circuit 302 includes transistors M3A and M3B, which are metal oxide semiconductor field effect transistors (MOSFETs). In one example, transistors M3A and M3B are P-type MOSFET devices; however, N-type MOSFET devices may be used. Additionally, transistors M3A and M3B may be N- or P-type bipolar junction transistors (BJTs). Other implementations of isolation circuit 302 may be used that provide a high impedance to the signal path and a low impedance to a power path as will be described below.

A current source 502 provides a bias current I2 though a resistor R2C, a transistor M4C, transistor M3C. Bias current I2 is used to set the voltages VCC, VCM, VN, and VT. The voltage VCC is below a voltage VDD. The biasing turns on transistors M4A, M3A, M4B, and M3B. Also, bias voltages VB1 and VB2 are used to bias transistors M1A, M2A, M1B, and M2B to turn on. Bias currents pass through resistors R1A, R2A, R2B, and R1B. Although resistors R1A, R2A, R2B, and R1B are shown, other components may be used to provide bias current. For example, a current source or inductor may be used in place of the resistors. Also, different combinations of resistors, current sources, and inductors may be used.

A signal (e.g., an RF signal) is input at input Vin. The signal flows through a signal path 506 from input Vin to output node Vop. Signal path 506 flows through an AC coupling capacitor Ci1, transistor M1A, transistor M2A, and a resistor RFA. Also, the signal flows through a signal path 508 to an output node Vom. Signal path 508 flows through an AC coupling capacitor Ci2, transistor M1B, transistor M2B, and a resistor RFB. Signal paths 506 and 508 provide amplified differential signals to output nodes Vop and Vom. The combination of resistors R1A, RFA, and R2A provide amplification of the signal in path 506 and combination of resistors R1B, RFB, and R2B provide amplification of the signal in path 508.

Particular embodiments provide reuse of bias current passing through transistors M4A and M4B. For example, at the node VCA, DC bias currents Ia and Ib both pass through transistor M1A. Conventionally, bias current Ib would not have passed through transistor M1A. In particular embodiments, however, the increase in current through transistor M1A increases the transductance of transistor M1A, which decreases the noise in amplifier 300 as discussed above.

At the node VCA, the bias current Ia may be a combination of the bias current through resistor R1A and resistor RFA. The bias current Ib may be a combination of the bias current through resistor R2A/transistor M4A and the bias current through resistor R2B/transistor M4B. The combination of bias currents Ia and Ib is I1.

A similar operation occurs at the node VCB. For example, at the node VCB, DC bias currents Ic and Id both pass through transistor M1B. Conventionally, bias current Id would not have passed through transistor M1B. In particular embodiments, however, the increase in current through transistor M1B increases the transductance of transistor M1B.

At the node VCB, the bias current Ic may be a combination of the bias current through resistor R1B and resistor RFB. The bias current Id may be a combination of the bias current through resistor R2B/transistor M4B and the bias current through resistor R2B/transistor M4A. The combination of bias currents Ic and Id is I1. Both bias currents I1 through transistors M1A and M1B are combined at a node VB1 and result in a current of 2I1 (I1+I1) through a transistor M5.

Transistors M3A and M3B also provide isolation in addition to allowing current reuse. The impedance looking into the drain of transistor M3A or transistor M3B is high due to the characteristics of the transistors. Thus, the signal through path 506 does not flow through transistor M3A because the signal flows through a path of lower resistance, which is through transistor M2A and resistor RFA. This is because looking into the source of transistor M2A is of a lower resistance than the resistance looking into the drain of transistor M3A. Also, the signal through path 508 does not flow through transistor M3B because the signal flows through a path of lower resistance, which is through transistor M2B and resistor RFB. This provides isolation between transistor M1A and transistor M4A (and also between transistor M1B and transistor M4B).

The impedance looking into a source of transistors M3A and M3B is low due to transistor characteristics. Thus, the currents Ib and Id flow through transistors M3A and M3B, respectively. By allowing the currents Ib and Id to supply transistors M1A and M1B, respectively, the transductance gm of transistors M1A and M1B increases by a factor given by $$\sqrt{\frac{Ia+Ib}{Ia}} \text{ and } \sqrt{\frac{Ic+Id}{Ic}},$$

respectively.

Isolation is also provided without using an inductor in the signaling path. As discussed above, using the inductor in the isolation circuit caused a narrowband frequency response for the gain because the inductor only provides a high impedance in a narrow band of frequency. However, particular embodiments provide a high impedance over a wideband of frequencies. An AC path through either AC coupling capacitor Ci1 or Ci2 or a DC path without using the AC coupling may be used. Referring to FIG. 4, the gain at 404 occurs when an AC coupling capacitor is used in the signal path. In other embodiments, the gain for amplifier 300 may be shown at 404 if DC coupling is used. That is, AC coupling capacitors Ci1 and Ci2 are not used. In either case, amplifier 300 provides gain over a wideband range of frequencies.

Additionally, a shunt at VCM connects transistors M4A and M4B to make amplifier 300 differential. The AC current flowing through the shunt is fixed. Because amplifier is differential, the AC current flowing through the shunt does not affect the gain at the output nodes Vop and Vom for the signals.

Figure 6:
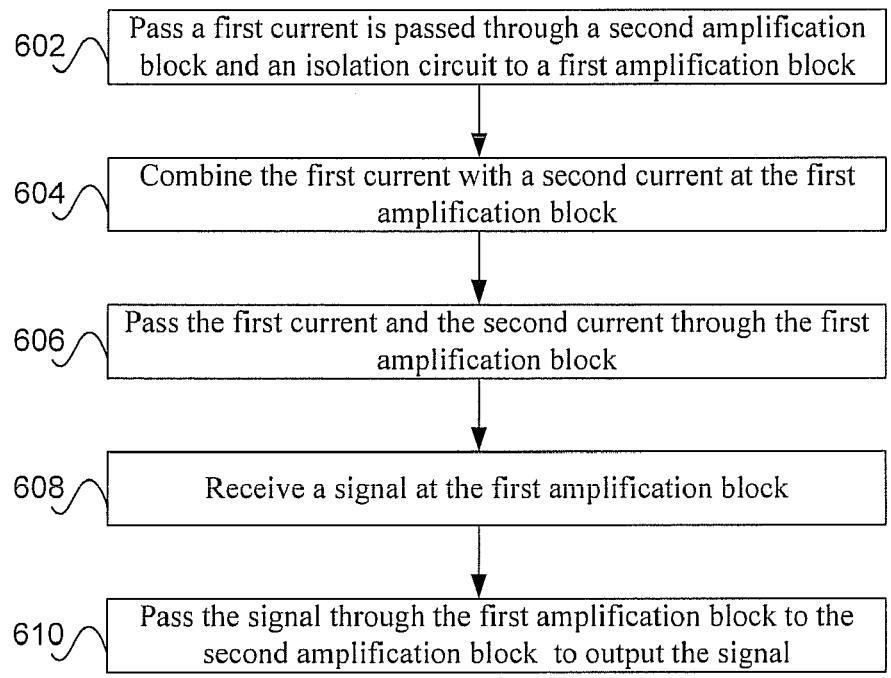
FIG. 6 depicts a method for amplifying a signal according to one embodiment.

FIG. 6 depicts a method for amplifying a signal according to one embodiment. At 602, a first current is passed through second amplification block 310b and an isolation circuit to first amplification block 310a.

At 604, the first current is combined with a second current at first amplification block 310a. At 606, the first current and the second current are passed through first amplification block 310a.

Also, at 608, a signal is received at first amplification block 310a. At 610, the signal is passed through first amplification block 310a to second amplification block 310b to output the signal. Isolation circuit 302 provides isolation between first amplification block 310a and second amplification block 310b to isolate the signal from flowing through the isolation circuit.

Accordingly, the reuse of current lowers the noise in amplifier 300 by increasing the transductance gm in transistors M1A and M1B. Also, isolation circuit 302 does not include an inductor in the bias current path, and thus provides a wideband frequency response for the gain of amplifier 300.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   a first amplification block configured to receive a signal;
   a second amplification block configured to output the signal, wherein the outputted signal is an amplified version of the signal; and
   a circuit allowing reuse of a second current flowing through the second amplification block by coupling the second current to pass through the first amplification block to increase a first current that flows through the first amplification block, wherein amplification of the signal is based on the increased first current that flows through the first amplification block.

2. The apparatus of claim 1, wherein the circuit provides isolation between the first amplification block and the second amplification block to restrict the signal from flowing through the circuit.

3. The apparatus of claim 1, wherein the second current is a bias current for the second amplification block.

4. The apparatus of claim 1, wherein the increase of the first current increases a transductance of a transistor of the first amplification block.

5. The apparatus of claim 4, wherein a gain of the transistor is increased due to the increase in the first current and the transductance.

6. The apparatus of claim 4, wherein noise in the first amplification block is reduced due to the increase in the first current and the transductance.

7. The apparatus of claim 1, wherein the first current and the second current are combined to flow through the first amplification block.

8. The apparatus of claim 1, wherein the first current is a first bias current for the first amplification block and the second current is a second bias current for the second amplification block.

9. The apparatus of claim 1, wherein the circuit comprises an active device.

10. The apparatus of claim 9, wherein the active device comprises a first terminal coupled to the first amplification block and a second terminal coupled to the second amplification block, wherein a first impedance looking into the first terminal is higher than a second impedance looking into the second terminal.

11. The apparatus of claim 10, wherein:
the signal is restricted from passing through the isolation circuit due to the first impedance into the drain, and
the second current passes through the circuit due to the second impedance into the second terminal.

12. A method comprising:
combining a first current at a first amplification block with a second current, wherein the second current is passed through a second amplification block and a circuit to the first amplification block;
passing the first current and the second current through the first amplification block; and
passing a signal through the first amplification block to the second amplification block to output an amplified version of the signal, wherein amplification of the signal is based on the first current and the second current being passed through the first amplification block.

13. The method of claim 12, further comprising isolating the first amplification block and the second amplification block to restrict the signal from flowing through the circuit.

14. The method of claim 12, wherein the first current is a bias current for the first amplification block and the second current is a bias current for the second amplification block.

15. The method of claim 12, wherein combining the first current and the second current increases a transductance of a transistor of the first amplification block.

16. The method of claim 15, wherein a gain of the transistor is increased due to the combining of the first current and the second current and the transductance.

17. The method of claim 15, wherein noise in the first amplification block is reduced due to the combining of the first current and the second current and the transductance.

18. The method of claim 15, wherein the first current is a first bias current for the first amplification block and the second current is a second bias current for the second amplification block.

19. The method of claim 12, wherein the circuit comprises an active device.

20. The method of claim 19, wherein the active device comprises a first terminal coupled to the first amplification block and a second terminal coupled to the second amplification block, wherein a first impedance looking into the first terminal is high and a second impedance looking into the second terminal is low.

* * * * *